United States Patent
Yun et al.

(10) Patent No.: US 12,205,837 B2
(45) Date of Patent: Jan. 21, 2025

(54) APPARATUS FOR TREATING A SUBSTRATE

(71) Applicant: SEMES CO., LTD., Cheonan-si (KR)

(72) Inventors: Seong Hyun Yun, Seongnam-si (KR); Jung Heum Nam, Gyeongju-si (KR)

(73) Assignee: SEMES CO., LTD., Cheonan-si (KR)

( * ) Notice: Subject to any disclaimer, the term of this patent is extended or adjusted under 35 U.S.C. 154(b) by 345 days.

(21) Appl. No.: 17/704,195

(22) Filed: Mar. 25, 2022

(65) Prior Publication Data

US 2022/0328333 A1 Oct. 13, 2022

(30) Foreign Application Priority Data

Apr. 7, 2021 (KR) .................. 10-2021-0044958

(51) Int. Cl.
*H01L 21/67* (2006.01)
*B65G 47/90* (2006.01)
(Continued)

(52) U.S. Cl.
CPC ........ *H01L 21/67276* (2013.01); *B65G 47/90* (2013.01); *H01J 37/32743* (2013.01); *H01L 21/67742* (2013.01); *H01L 21/68707* (2013.01)

(58) Field of Classification Search
CPC ............... H01L 21/66; H01L 21/67–68; H01L 21/67265; H01L 21/67276;
(Continued)

(56) References Cited

U.S. PATENT DOCUMENTS

2006/0215347 A1* 9/2006 Wakabayashi .... H01L 21/67167
361/234
2018/0294174 A1* 10/2018 Fujikata ............... G05B 19/058
(Continued)

FOREIGN PATENT DOCUMENTS

JP H07322381 A 12/1995
JP 2018207253 A * 12/2018 ............... H04R 1/00
(Continued)

OTHER PUBLICATIONS

Korean Office Action dated Jan. 26, 2023 issued in corresponding Korean Appln. No. 10-2021-0044958.
(Continued)

*Primary Examiner* — Nguyen Q. Ha
(74) *Attorney, Agent, or Firm* — Harness, Dickey & Pierce, P.L.C.

(57) ABSTRACT

The inventive concept provides a substrate treating apparatus. The substrate treating apparatus includes a process chamber configured to treat a substrate; a transfer assembly configured to transfer the substrate to the process chamber; and a diagnosis unit configured to detect an abnormal state of the transfer assembly, and wherein the transfer assembly comprises: a housing having a transfer space; and a transfer robot configured to transfer the substrate to the process chamber, and wherein the diagnosis unit comprises: a detection member for detecting an air vibration generated within the housing; and a diagnosis member for diagnosing a driving unit of the transfer assembly based on the air vibration detected by the detection member.

20 Claims, 9 Drawing Sheets

(51) Int. Cl.
*H01J 37/32* (2006.01)
*H01L 21/677* (2006.01)
*H01L 21/687* (2006.01)

(58) Field of Classification Search
CPC ......... H01L 21/67742; H01L 21/67781; H01L 21/68707; H01J 37/32743; B65G 47/90
See application file for complete search history.

(56) References Cited

U.S. PATENT DOCUMENTS

2019/0339119 A1* 11/2019 Tamatsukuri ......... H01L 21/677
2021/0280442 A1* 9/2021 Kim ................. H01L 21/67781

FOREIGN PATENT DOCUMENTS

| KR | 100250283 | B1 | | 4/2000 | |
|---|---|---|---|---|---|
| KR | 20080071814 | A | * | 8/2008 | ............. H01L 21/02 |
| KR | 101812926 | B1 | | 1/2018 | |
| KR | 10-2019-0095278 | A | | 8/2019 | |

OTHER PUBLICATIONS

Korean Office Action dated Jul. 29, 2023 issued in corresponding Korean Appln. No. 10-2021-0044958.

* cited by examiner

APPARATUS FOR TREATING A SUBSTRATE

CROSS-REFERENCE TO RELATED APPLICATIONS

A claim for priority under 35 U.S.C. § 119 is made to Korean Patent Application No. 10-2021-0044958 filed on Apr. 7, 2021, in the Korean Intellectual Property Office, the entire contents of which are hereby incorporated by reference.

BACKGROUND

Embodiments of the inventive concept described herein relate to an apparatus for treating a substrate, more specifically, an apparatus for treating a substrate diagnosing an abnormal state of a driving unit of a transfer assembly.

In order to manufacture a semiconductor device, various processes such as deposition, photography, etching, and cleaning are performed. The deposition process is a process of forming a thin film on a substrate such as a wafer. In addition, the photography process includes a coating process, an exposing process, and a developing process. The coating process is a process of applying a photosensitive solution such as a photoresist solution on the substrate. The exposing process is a process of transferring a circuit pattern onto the substrate by exposing a light from a light source through a photomask on the applied photoresist film. And the developing process is a process of selectively developing an exposed area of the substrate. In addition, the etching process is a process of removing the thin film formed on the substrate. In addition, the cleaning process is a process of removing by-products generated in a process of treating the substrate by supplying a cleaning liquid and a rinsing liquid to the substrate.

The above-described various substrate treating processes are performed in a process chamber having a treating space for treating the substrate. Accordingly, a general substrate treating apparatus has a transfer assembly for transferring the substrate to the process chamber. A transfer robot for transferring the substrate to the process chamber while supporting the substrate and a transfer rail (e.g., LM guide) for guiding a linear movement of the transfer robot are installed in the transfer assembly. A driving unit is provided inside the transfer assembly. For example, the driving unit includes a horizontal driving unit provided to enable a horizontal movement of the transfer robot, a vertical driving unit provided to enable a vertical movement of the transfer robot, and a rotational driving unit provided to enable a rotational movement of the transfer robot. Each driving unit may be provided with various motors, timing belts, bearings, or the like.

An inside of the substrate treating apparatus is exposed to various environmental factors such as a noise and a flow generated by various apparatuses. It is difficult to determine whether the driving unit provided to the transfer assembly has a defect or not due to environmental factors inside the substrate treating apparatus. If a defect of the driving unit is overlooked and left unattended, the substrate is not returned to the correct position, resulting in a defect in the substrate treating process.

SUMMARY

Embodiments of the inventive concept provide a substrate treating apparatus for diagnosing an abnormal state of a driving unit of a transfer assembly transferring a substrate.

Embodiments of the inventive concept provide a substrate treating apparatus for diagnosing an abnormal state of a driving unit of a transfer assembly without being affected by an internal environment of the substrate treating apparatus.

Embodiments of the inventive concept provide a substrate treating apparatus for improving a diagnostic reliability of an abnormal state with respect to a driving unit by detecting an air vibration while minimizing an influence by an air flow.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a process chamber configured to treat a substrate; a transfer assembly configured to transfer the substrate to the process chamber; and a diagnosis unit configured to detect an abnormal state of the transfer assembly, and wherein the transfer assembly comprises: a housing having a transfer space; and a transfer robot configured to transfer the substrate to the process chamber, and wherein the diagnosis unit comprises: a detection member for detecting an air vibration generated within the housing; and a diagnosis member for diagnosing a driving unit of the transfer assembly based on the air vibration detected by the detection member.

In an embodiment, the detection member comprises: an inlet part for introducing the air vibration generated within the housing; and a body part having a valve configured to provide a vibration in response to the air vibration introduced from the inlet part.

In an embodiment, the inlet part includes a mesh structure.

In an embodiment, the inlet part includes a porous member.

In an embodiment, the diagnosis member comprises: a conversion unit for converting the vibration of the valve to a waveform; a diagnosis unit for diagnosing the waveform converted by the conversion unit; and a display unit for displaying the result of the analyzing the waveform.

In an embodiment, the diagnosis unit determines the driving unit of the transfer assembly to be in an abnormal state when a peak value of the waveform converted by the conversion unit is outside a preset normal range waveform.

In an embodiment, the diagnosis unit is installed within the housing.

In an embodiment, the diagnosis unit is installed at any stationary member within the housing.

In an embodiment, the transfer assembly further comprises a transfer rail installed along a lengthwise direction of the housing and configured to guide a moving direction of the transfer robot, and wherein the detection unit is installed at the transfer rail.

In an embodiment, the detection unit is installed at a middle point of the transfer rail.

The inventive concept provides a substrate treating apparatus. The substrate treating apparatus includes a first unit; a second unit which is different from the first unit; a transfer assembly configured to transfer a substrate between the first unit and the second unit; and a diagnosis unit configured to detect an abnormal state of the transfer assembly, and wherein the transfer assembly comprises: a housing having a transfer space; and a transfer robot configured to transfer the substrate, and wherein the diagnosis unit comprises: a detection member for detecting an air vibration generated within the housing; and a diagnosis member for diagnosing a driving unit of the transfer assembly based on the air vibration detected by the detection member.

In an embodiment, the detection member comprises: an inlet part for introducing the air vibration generated within the housing; and a body part having a valve configured to provide a vibration in response to the air vibration introduced from the inlet part.

In an embodiment, the inlet part includes a mesh structure.

In an embodiment, the diagnosis member comprises: a conversion unit for converting the vibration of the valve a waveform; a diagnosis unit for diagnosing the waveform converted by the conversion unit; and a display unit for displaying the result of the analyzing the waveform.

In an embodiment, the diagnosis unit determines the driving unit of the transfer assembly to be in an abnormal state when a peak value of the waveform converted by the conversion unit is outside a preset normal range waveform.

In an embodiment, the diagnosis unit is installed at any stationary member within the housing.

In an embodiment, the transfer assembly further comprises a transfer rail installed along a lengthwise direction of the housing and configured to guide moving direction of the transfer robot, and wherein the detection unit is installed at the transfer rail.

The inventive concept provides a substrate treating apparatus. The substrate treating apparatus includes an index module having a load port for placing a container storing a substrate therein; a treating module having a process chamber for performing a process of treating the substrate; a transfer assembly provided at least one of the index module and the treating module, and configured to transfer the substrate; and a diagnosis member for detecting an abnormal state of the transfer assembly, and wherein the transfer assembly comprises: a housing having a transfer space; and a transfer robot configured to transfer the substrate, and wherein the diagnosis unit comprises: an inlet part for introducing an air vibration generated within the housing; and a body part having a valve configured to provide a vibration in response to the air vibration introduced from the inlet part, and wherein the inlet part includes a mesh structure.

In an embodiment, the diagnosis unit further comprises: a conversion unit for converting the vibration of the valve to a waveform; a diagnosis unit for diagnosing the waveform converted by the conversion unit; and a display unit for displaying the result of the analyzing the waveform, and wherein a driving unit of the transfer assembly is determined to be in an abnormal state when a peak value of the waveform converted by the conversion unit is outside a preset normal range waveform.

In an embodiment, the transfer assembly further comprises a transfer rail installed along a lengthwise direction of the housing and configured to guide a moving direction of the transfer robot, and wherein the detection unit is installed at the transfer rail.

According to an embodiment of the inventive concept, an abnormal state of a moving body of a transfer assembly may be more accurately detected.

According to an embodiment of the inventive concept, a sound of the moving body of the transfer assembly may be introduced to diagnose an abnormal state of the moving body.

According to an embodiment of the inventive concept, a reliability of whether there is a defect or not in a moving body of a transfer assembly may be determined by detected a sound of the moving body while minimizing an influence of the wind.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described with reference to FIG. 1 to FIG. 9.

Figure 1:
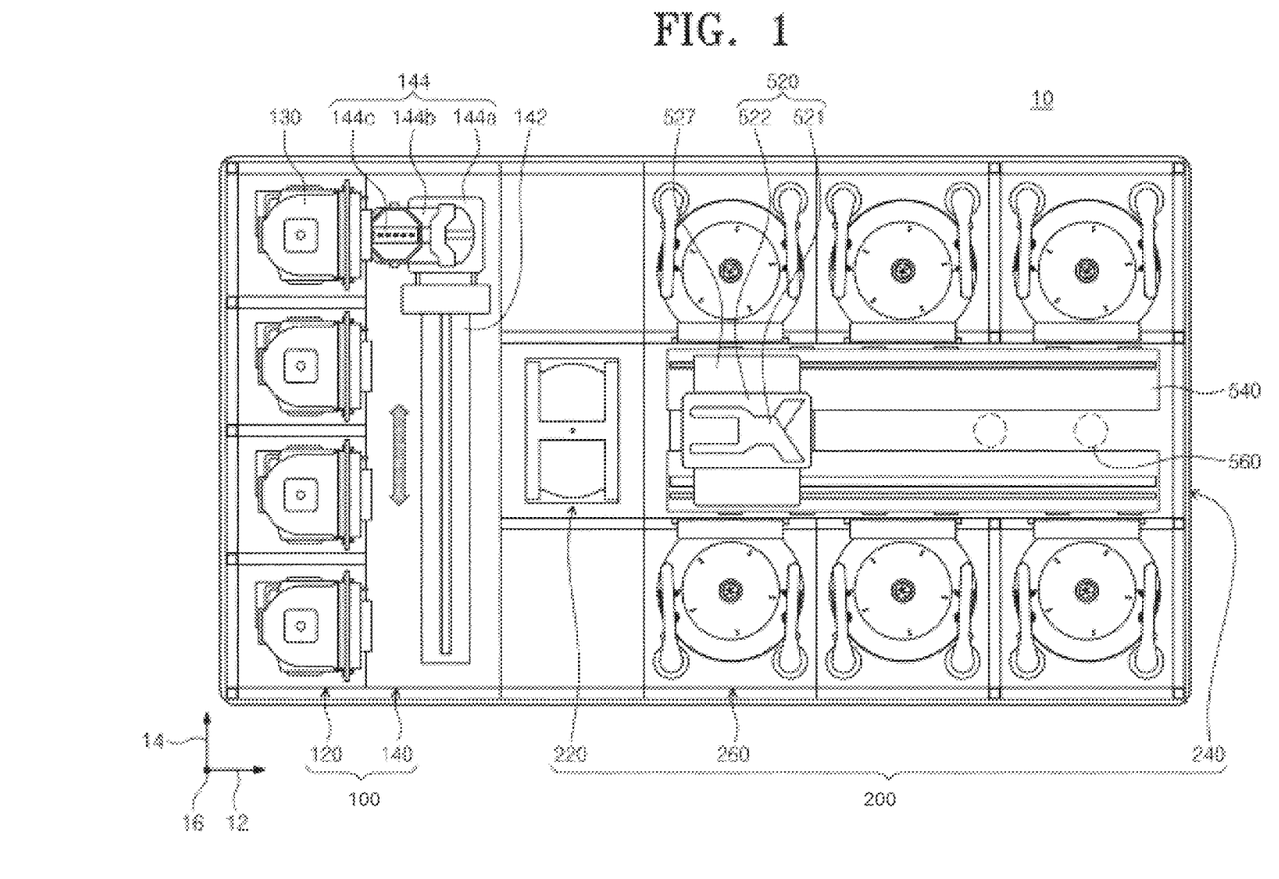
FIG. 1 is a view schematically illustrating a substrate treating apparatus according to an embodiment of the inventive concept.

FIG. 1 is a view schematically illustrating a substrate treating apparatus according to an embodiment of the inventive concept. Referring to FIG. 1, the substrate treating apparatus 10 has an index module 100 and a treating module 200. The index module 100 has a load port 120 and a transfer frame 140. The load port 120, the transfer frame 140, and the treating module 200 are sequentially arranged in a direction. Hereinafter, the direction in which the load port 120, the transfer frame 140, and the treating module 200 are arranged is referred to as a first direction 12, a direction perpendicular to the first direction 12 is referred to as a second direction 14, and a direction perpendicular to a plane including the first direction 12 and the second direction 14 is referred to as a third direction 16.

A carrier 130 in which the substrate W is accommodated is seated in the load port 120. A plurality of load ports 120 are provided, and they are arranged along the second direction 14. The number of load ports 120 may increase or decrease according to process efficiency and foot print conditions of the treating module 200. A plurality of slots (not shown) for accommodating the substrates W horizontally disposed with respect to the ground are formed in the carrier 130. As the carrier 130, a front opening unified pod FOUP may be used.

The treating module 200 includes a buffer unit 220, a transfer chamber 240, and a process chamber 260. The transfer chamber 240 is disposed in a lengthwise direction parallel to the first direction 12. Process chambers 260 are disposed on both sides of the transfer chamber 240, respectively. The process chambers 260 may be symmetrically arranged on both sides of the transfer chamber 240. In each side of the transfer chamber 240, the process chambers 260 are arranged along a lengthwise direction (e.g., the first direction 12) of the transfer chamber 240 with stacking one another along the third direction 16. That is, the process chambers 260 may be arranged in an arrangement of A×B on each side of the transfer chamber 240. Here, A is the number of process chambers 260 provided along the first direction 12, and B is the number of process chambers 260 provided along the third direction 16. When four or six process chambers 260 are provided on each side of the transfer chamber 240, the process chambers 260 may be arranged in an arrangement of 2×2 or 3×2 in each side. The number of process chambers 260 may increase or decrease. Unlike the above description, the process chamber 260 may be provided only on one side of the transfer chamber 240. In addition, the process chamber 260 may be provided in a single layer (without stacking) on one side and/or both sides of the transfer chamber 240.

The buffer unit 220 is disposed between the transfer frame 140 and the transfer chamber 240. The buffer unit 220 provides a space in which the substrate W stays before the substrate W is transferred between the transfer chamber 240 and the transfer frame 140. A slot (not shown) in which the substrate W is placed is provided inside the buffer unit 220. A plurality of slots (not shown) are provided to be spaced apart from each other in the third direction 16. The buffer unit 220 has an open side facing the transfer frame 140 and an open side facing the transfer chamber 240.

The transfer frame 140 provides a transfer space for transferring the substrate W between the carrier 130 seated on the load port 120 and the buffer unit 220. An index rail 142 and an index robot 144 are provided inside the transfer frame 140. The index rail 142 is provided in parallel with the second direction 14 in which a lengthwise direction thereof is the lengthwise direction of the index frame. The index robot 144 is installed on the index rail 142 and moves linearly in the second direction 14 along the index rail 142. The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be forwardly and backwardly movable with respect to the body 144b. A plurality of index arms 144c are provided to be individually driven. The index arms 144c are disposed to be stacked while being spaced apart from each other in the third direction 16. Some of the index arms 144c may be used to transfer the substrate W from the treating module 200 to the carrier 130, and some of the others may be used to transfer the substrate W from the carrier 130 to the treating module 200. This may prevent particles generated from the substrate W before a process treating from being attached to the substrate W after the process treating during a process of bringing in and taking out the substrate W by the index robot 144.

The transfer chamber 240 provides a transfer space for transferring the substrate W between the buffer unit 220 and the process chamber 260 and between the process chambers 260. A transfer robot 520 and a transfer rail 540 are provided inside the transfer chamber 240. The transfer rail 540 is provided parallel with the first direction 12 in which a lengthwise direction thereof is the lengthwise direction of the transfer chamber. The transfer robot 520 is installed on the transfer rail 540 and moves linearly in the first direction 12 along the transfer rail 540. The transfer robot 520 may transfer the substrate W to a desired process chamber 260 among the process chambers 260 while linearly moving along the transfer rail 540 in the first direction 12, or may take the substrate W out of the process chamber 260 selected from the process chambers 260. The transfer robot 520 will be described in detail later.

The process chamber 260 is provided with a substrate treating apparatus for performing a liquid treatment process on the substrate W. For example, the process chamber 260 may be a chamber that performs a cleaning process by supplying a cleaning liquid to the substrate W. Unlike this, the process chamber 260 may be a chamber that performs a wet etching process of removing a thin film from the substrate by supplying a liquid plasma. The substrate treating apparatus provided in the process chamber 260 may have a different structure depending on a type of process of treating the substrate W. Alternatively, the substrate treating apparatuses in each process chamber 260 may have the same structure. Optionally, process chambers 260 are divided into a plurality of groups, and process chambers 260 belonging to any one of the groups may be process chambers 260 performing any one of a cleaning process and a wet etching process, and process chambers 260 belonging to the other group may be process chambers 260 performing the other of a cleaning process and a wet etching process.

Figure 2:
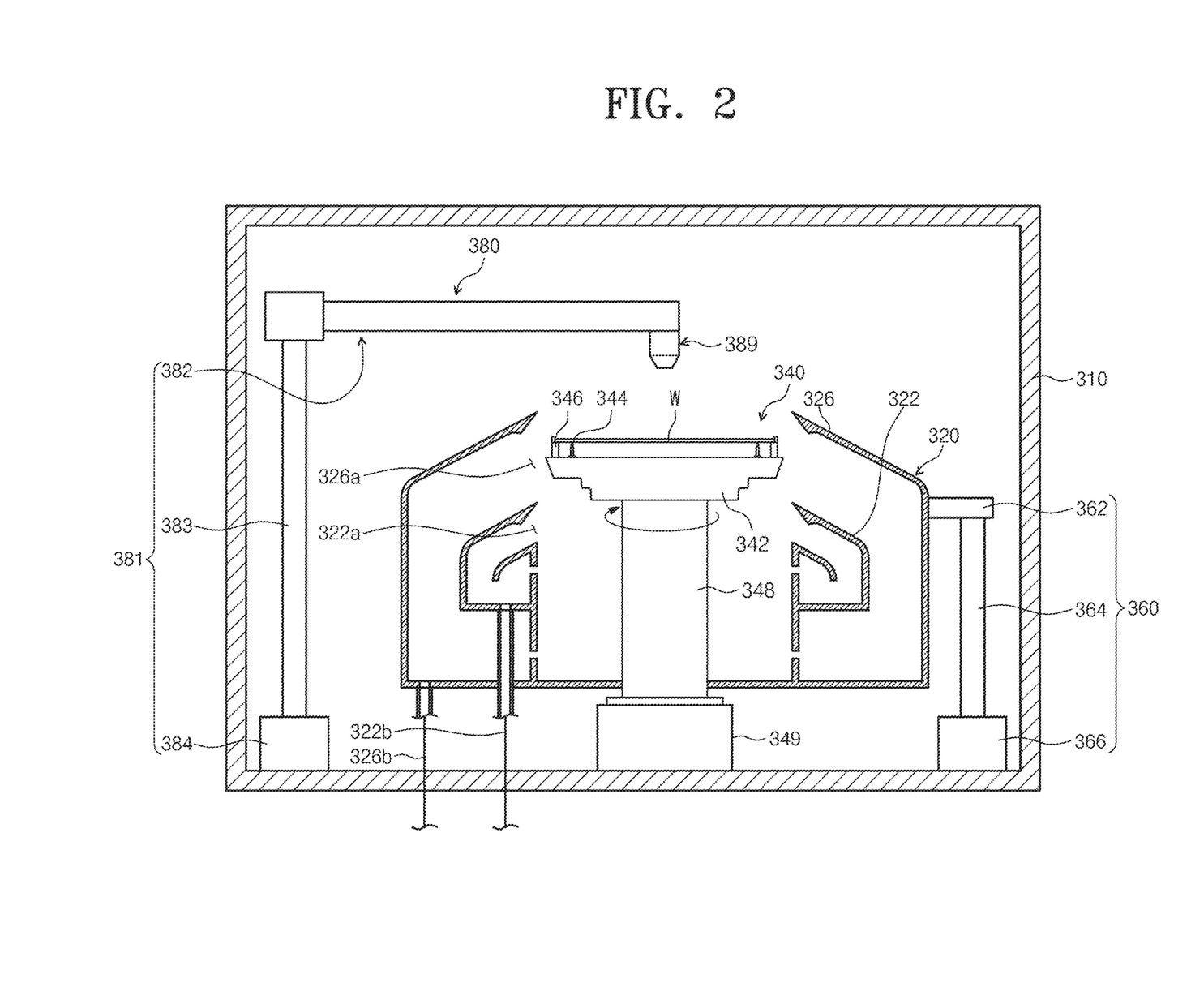
FIG. 2 is a view illustrating a substrate treating apparatus provided in a process chamber of FIG. 1.

FIG. 2 is a view illustrating a substrate treating apparatus provided in the process chamber of FIG. 1. The substrate treating apparatus 300 may include a housing 310, a treating container 320, a support unit 340, a lifting/lowering unit 360, and a liquid supply unit 380.

The housing 310 has a treating space 312 therein. A treating container 320, a support unit 340, a lifting/lowering unit 360, and a liquid supply unit 380 may be provided in an inner space 312 of the housing 310. The housing 310 may have a substantially rectangular parallelepiped shape. However, the inventive concept is not limited thereto, and the housing 310 may be modified into various shapes.

The treating container 320 may have a cylindrical shape with an open top. The treating container 320 has an inner recollecting container 322 and an outer recollecting container 326. Each of the recollecting containers 322 and 326 recovers a different treating liquid among the treating liquids used in the process. The inner recollecting container 322 is provided in an annular ring shape surrounding the substrate support unit 340, and the outer recollecting container 326 is provided in an annular ring shape surrounding the inner recollecting container 326. An inner space 322a of the inner recollecting container 322 functions as a first inlet 322a through which a treating liquid is introduced into the inner recollecting container 322. A space 326a between the inner recollecting container 322 and the outer recollecting container 326 functions as a second inlet 326a through which the treating liquid flows into the outer recollecting container 326. According to an embodiment, each of the inlets 322a and 326a may be located at different heights. A recollecting lines 322b and 326b are connected to the bottom of each of the recollecting containers 322 and 326. The treating liquids introduced into each of the recollecting containers 322b and 326b can be provided and reused to an external treating liquid regeneration system (not illustrated) through the recollecting lines 322b and 326b.

The support unit 340 supports the substrate W in the treating space 312. The support unit 340 supports and rotates the substrate W during the process. The support unit 340 has a support plate 342, a support pin 344, a chuck pin 346, and rotation driving members 348 and 349.

The support plate 342 is provided in a substantially circular plate shape and has a top surface and a bottom surface. The bottom surface has a smaller diameter than the top surface. The support plate 342 may have horizontal cross-sectional areas, which gradually decrease from the top to the bottom. The top surface and the bottom surface are configured such that their central axes coincide with each other. In addition, a heating means (not shown) is provided in the support plate 342 to heat the substrate according to the type of liquid that processes the substrate during the liquid treatment.

The support pin 344 is provided in a plurality. The support pins 344 are disposed along an edge of the top surface of the support plate 342 with being spaced apart from each other by a predetermined distance, thereby defining an annular ring shape as a whole and upwardly protruding from the support plate 342. The support pins 344 support an edge of a bottom surface of the substrate W so that the substrate W is spaced apart from the top surface of the support plate 342 by a predetermined distance.

The chuck pin 346 is provided in a plurality. The chuck pins 346 are disposed farther from a center of the support plate 342 than the support pins 344. The chuck pins 346 are provided to upwardly protrude from the top surface of the support plate 342. The chuck pins 346 support side portions of the substrate W so that the substrate W is not laterally separated from a predetermined position when the support plate 342 is rotated. The chuck pins 346 are provided to be able to move linearly along a radial direction of the support plate 324 between an outer position and an inner position. The outer position is a position away from the center of the support plate 342 compared to the inner position. When the substrate W loads or unloads on the support plate 342, the chuck pins 346 are positioned at the outer position, and when the process is performed on the substrate W, the chuck pins 346 are positioned at the inner position. The inner position is a position where the chuck pins 346 and the side portion of the substrate W are in contact with each other, and the outer position is a position where the chuck pins 346 and the substrate W are spaced apart from each other.

The rotary driving members 348 and 349 rotate the support plate 342. The support plate 342 may rotate around a central axis thereof by the rotary driving members 348 and 349. The rotary driving members 348 and 349 include a support shaft 348 and a driving unit 349. The support shaft 348 extends along the third direction 16. A top end of the support shaft 348 is fixedly coupled to the bottom surface of the support plate 342. According to an embodiment, the support shaft 348 may be fixedly coupled to a center of the bottom surface of the support plate 342. The driving unit 349 provides a driving force to rotate the support shaft 348. The support shaft 348 is rotated by the driving unit 349, and the support plate 342 may be rotated together with the support shaft 348.

The lifting/lowering unit 360 linearly moves the treating container 320 in an up/down direction. As the treating container 320 is moved up and down, a relative height of the treating container 320 with respect to the support plate 342 is changed. When the substrate W is loaded or unloaded on the support plate 342, the treating container 320 of the lifting/lowering unit 360 is lowered such that the support plate 342 upwardly protrudes from the treating container 320. In addition, when the process proceeds, a height of the treatment container 320 is adjusted so that the treating liquid may flow into preset recollecting containers 322 and 326 according to a type of treating liquid supplied to the substrate W. The lifting/lowering unit 360 has a bracket 362, a moving shaft 364, and a driver 366. The bracket 362 is fixedly installed on an outer wall of the treating container 320, and the moving shaft 364 moving in the up/down direction by the driver 366 is fixedly coupled to the bracket 362. Optionally, the lifting/lowering unit 360 may move the support plate 342 in the up/down direction.

The liquid supply unit 380 may supply the treating liquid to the substrate W. The treating liquid may be a chemical, a rinsing liquid, a wetting liquid, a cleaning liquid, or an organic solvent. The chemical may be an acidic or basic liquid. The chemical may include a sulfuric acid $H_2SO_4$, a phosphoric acid $P_2O_5$, a hydrofluoric acid HF, and an ammonium hydroxide $NH_4OH$. The chemical may be a diluted sulfuric acid peroxide DSP mixture. The cleaning liquid, the rinsing liquid, and the wetting liquid may be a deionized water $H_2O$. The organic solvent may be an isopropyl alcohol IPA liquid.

The liquid supply unit 380 may include a moving member 381 and a nozzle 389. The moving member 381 moves the nozzle 389 to a process position and a standby position. The process position is a position at which the nozzle 389 faces the top surface of the substrate W supported by the support unit 340. According to an embodiment, the process position is a position at which the treating liquid is discharged to the top surface of the substrate W. In addition, the process position includes a first supply position and a second supply position. The first supply position may be a position closer to a center of the substrate W than the second supply position, and the second supply position may be a position relatively closer to an edge region of the substrate than the center of the substrate. Optionally, the second supply position may be an area adjacent to an end of the substrate. The standby position is defined as a position where the nozzle 389 deviates from the process position. According to an embodiment, the standby position may be a position at which the nozzle 389 stands-by before or after a process treating is completed on the substrate W.

The moving member 381 includes an arm 382, a support shaft 383, and a driver 384. The support shaft 383 is located near the sidewall of the treating container 320. The support shaft 383 has a rod shape with extending along the third direction. The support shaft 383 is provided to be rotatable by the driver 384. The support shaft 383 is provided to be upwardly and downwardly movable. The arm 382 is coupled to a top end of the support shaft 383. The arm 382 extends horizontally, i.e., perpendicularly from the support shaft 383. A nozzle 389 is coupled to an end of the arm 382. As the support shaft 383 is rotated, the nozzle 389 may swing together with the arm 382. The nozzle 389 may swing and be moved to a process position and a standby position. Optionally, the arm 382 may be provided to be forwardly and backwardly movable in its lengthwise direction. When viewed from above, a central axis of the substrate W may be positioned on a path through which the nozzle 389 moves.

Figure 3:
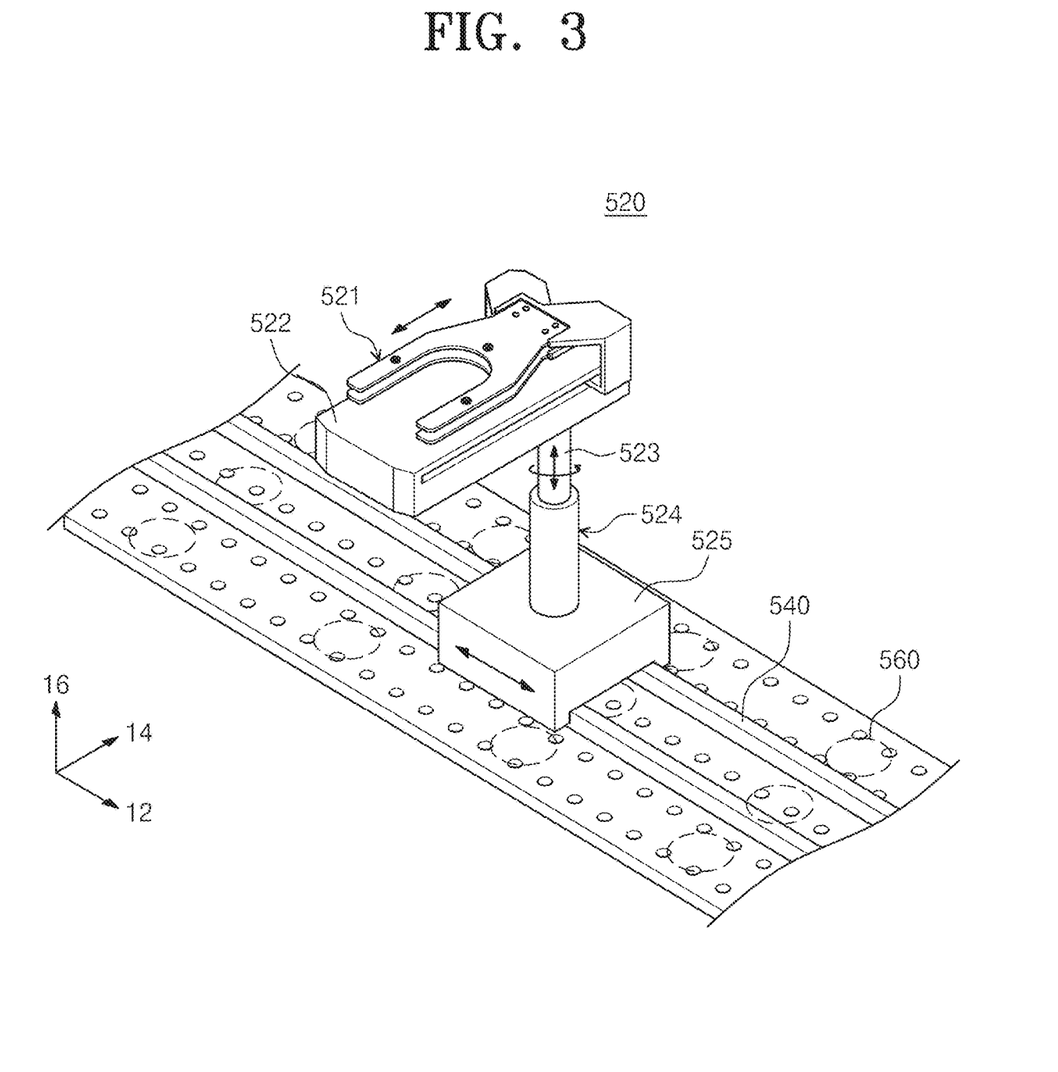
FIG. 3 is a view illustrating a substrate treating apparatus provided in a transfer chamber of FIG. 1.

FIG. 3 is a view illustrating an embodiment of the transfer chamber 240 provided in the substrate treating apparatus 10 of FIG. 1. Referring to FIG. 1 and FIG. 3, the transfer chamber 240 may transfer the substrate W between the process chamber 260 and the buffer unit 220 and between the process chambers 260. The transfer chamber 240 may provide the transfer space for transferring the substrate W.

A flow supply unit (not shown) forming a downward flow into an inner space of the transfer chamber 240 may be provided on a top surface of the transfer chamber 240. The flow supply unit includes a fan and a filter. The flow supply unit supplies an external air to the housing. The filter removes impurities contained in the air. The fan forms the downward flow in the inner space of the transfer chamber 240. In the flow supply unit, various particles generated in the inner space of the transfer chamber 240 are discharged to the outside together with the downward flow through the exhaust member. An exhaust member 560 may be installed on a bottom surface of the transfer chamber 240. The flow formed inside the transfer chamber 240 is exhausted to the outside of the substrate treating apparatus 10 through the exhaust member 560.

A transfer robot 520 and a transfer rail 540 are provided inside the transfer chamber 240. The transfer robot 520 may include a hand 521, a hand driving unit 522, a rotation driving unit 523, a vertical driving unit 524, and a horizontal driving unit 525.

Specifically, the hand 521 may support the substrate W. The hand 521 is installed on a top portion of the hand driver 522. The hand driver 522 may horizontally move the hand 521. The number of hands 521 may increase according to an efficiency of the substrate treating process. In an embodiment, when a plurality of hands 521 are provided, some may be used to transfer the substrate W to the process chamber 260, and the others may be used to transfer the substrate W out of the process chamber 260. A rotation driving unit 523 is installed below the hand driving unit 522. The rotation driving unit 523 is coupled to the hand driving unit 522 and rotates itself to rotate the hand driving unit 522. Accordingly, the hand 521 coupled to the hand driving unit 522 may rotate together, and the hand 521 may be provided to be movable along the first direction 12 and/or the second direction 14.

The vertical driving unit 524 is installed below the rotation driving unit 523, and the horizontal driving unit 525 is installed below the vertical driving unit 524. The vertical driving unit 524 is coupled to the rotation driving unit 523 to lift and lower the rotation driving unit 523, thereby adjusting the vertical positions of the hand 521 and the hand driver 522. Accordingly, the hand 521 may be provided to be movable along the third direction 16. The horizontal moving part 525 is coupled to the transfer rail 540 and moves linearly along the first direction 12 on the transfer rail. In an embodiment, the hand driving unit 522, the rotation driving unit 523, the vertical driving unit 524, and the horizontal driving unit 525 may be provided as a motor. As the transfer robot 520 moves along the first direction 12, the transfer robot 520 may selectively transfer/take out the substrate W to/from the process chamber 260.

The driving unit provided inside the transfer chamber 240 may move in its position within the transfer chamber 240. In an embodiment, the driving unit provided inside the transfer chamber 240 may be the hand driving unit 522, the rotation driving unit 523, the vertical driving unit 524, and the horizontal driving unit 525.

The transfer robot 520 described in the above example corresponds to an embodiment, and a configuration of the transfer robot 520 may be variously modified into a known robot unit capable of transferring the substrate W.

Figure 4:
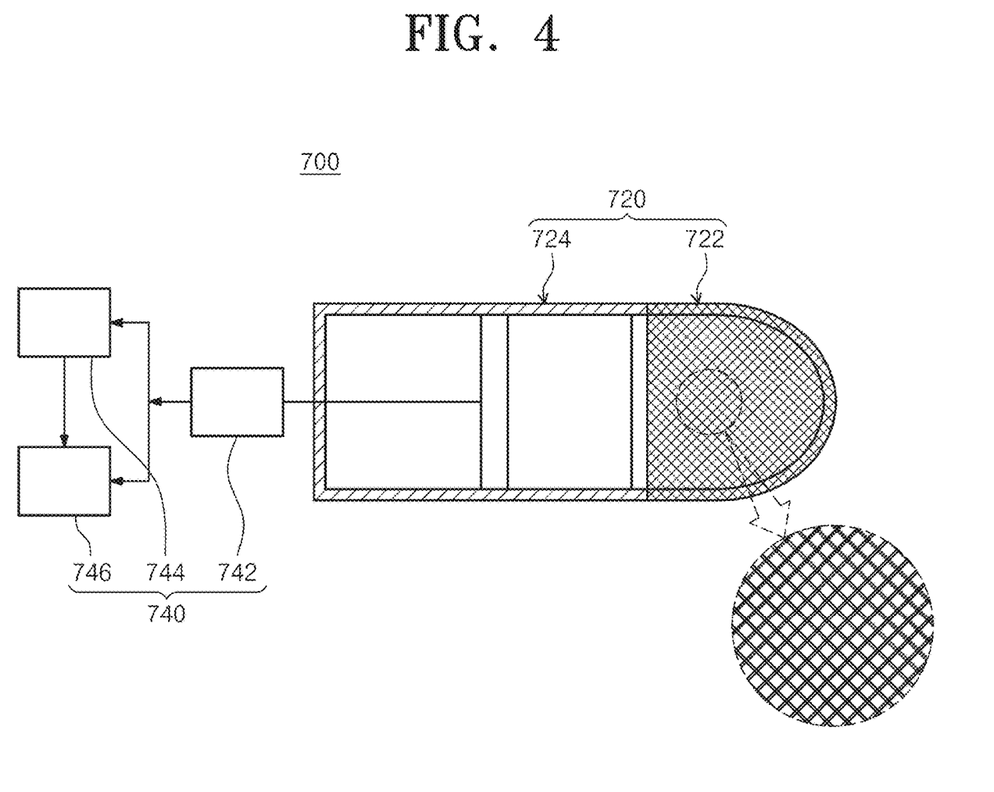
FIG. 4 is a view illustrating an embodiment of a diagnosis unit provided in the substrate treating apparatus of FIG. 3.

FIG. 4 is a view illustrating an embodiment of a diagnosis unit provided to the substrate treating apparatus. Referring to FIG. 4, the diagnosis unit 700 may include a detection member 720 and a diagnosis member 740. The diagnosis unit 700 is installed in the transfer chamber 240.

The detection member 720 diagnoses a vibration of an air generated in the transfer space inside the transfer chamber 240. The detection member 720 may include an inlet part 722 and a body part 724.

The inlet part 722 introduces an air vibrating in the transfer space inside the transfer chamber 240. The inlet part 722 may extend from an end of the body part 724 and may have a generally rounded shape. The inlet part 722 may be provided in a mesh structure in the form of a mesh on an outer circumferential surface. The inlet part 722 may be formed of a plastic material.

The body part 724 may be a hollow cylindrical shape with one end connected to the inlet part 722 and the other end closed. The body part 724 is provided with a valve that vibrates in response to a vibration of an air received from the inlet part 722. The valve may be provided as a thin film as to vibrate even by fine vibration of the air. The shapes of the inlet part 722 and the body part 724 are not limited thereto, and may be modified into various shapes and provided.

An airflow may be formed in the transfer space by the flow supply unit (not shown) installed on the top surface of the transfer chamber 240 and the exhaust member 621 installed on the bottom surface. In addition, the airflow may be formed in the transfer space by the driving unit provided inside the transfer chamber 240. It is not limited thereto, and the airflow is formed inside the transfer space due to various causes. The inlet part 722 may have a mesh structure defining fine spaces, which may block the airflow formed inside the transfer space and may introduce (e.g., deliver) only the vibration of the air generated by the driving part. Accordingly, only the vibration of a pure air formed by the driving unit may be provided to the valve. Accordingly, it is possible to increase a detection reliability of the vibration of the air generated by the driving unit provided inside the transfer chamber 240.

The diagnosis member 740 diagnoses an abnormal state of the driving unit provided inside the transfer chamber 240 based on the vibration of the air introduced from the detection member 720. The diagnosis member 740 may include a conversion unit 742, a diagnosis processing unit 744, and a display unit 746.

The conversion unit 742 converts the vibration of the air introduced into the transfer chamber 240 into a waveform through a vibration of the valve. The conversion unit 742 transmits signals of a converted waveform to the diagnosis unit 744 and the display unit 746, respectively.

The diagnosis processing unit 744 diagnoses the driving unit provided inside the transfer chamber 240 using the converted waveform converted by the conversion unit 742. When the driving unit provided inside the transfer chamber 240 is in a normal state, the waveform for the vibration of the air inside the transfer space is defined as a reference range waveform.

Figure 5:
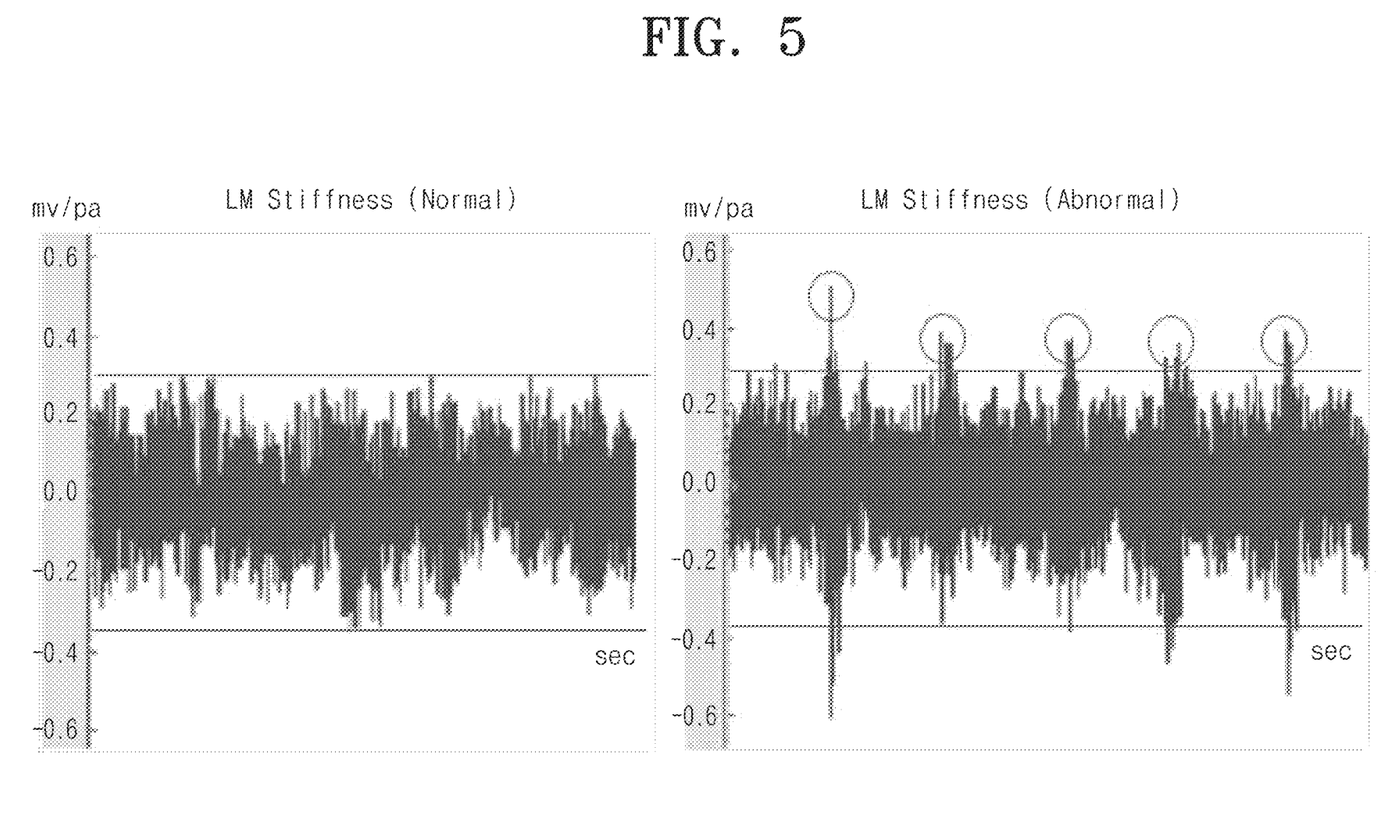
FIG. 5 is an evaluation view of a waveform stiffness of a diagnosis unit provided in the substrate treating apparatus of FIG. 3.

FIG. 5 is an evaluation view illustrating a waveform stiffness of the diagnosis unit 700. Referring to FIG. 5, the diagnosis processing unit 744 may determine that an abnormality occurs in the driving unit provided inside the transfer chamber 240 when a peak value of the converted waveform goes beyond a peak value range of a normal waveform. In addition, if a graph of the converted waveform does not match a graph of the reference range waveform, the diagnosis processing unit 744 may determine the driving unit provided inside the transfer chamber 240 to be in an abnormal state. In addition, the diagnosis processing unit 744 may determine whether the driving unit provided inside the transfer chamber 240 has a defect by comparing a numerical value of a converted waveform when the driving unit provided inside the transfer chamber 240 passes a specific position with a numerical value of the reference range waveform. An abnormal state of the driving unit provided inside the transfer chamber 240 means that an abnormality has occurred in at least one motor of the hand driving unit 522, the rotation driving unit 523, the vertical driving unit 524, and the horizontal driving unit 525 or a timing belt etc.

Referring back to FIG. 4, the display unit 746 is connected to the conversion unit 742 and the diagnosis processing unit 744. The display unit 746 may convert a waveform converted by the converter 742 into an electrical signal and display the waveform of the transfer space inside the transfer chamber 240. Accordingly, an operator may monitor whether the driving unit provided inside the transfer chamber 240 has a defect in real time. The display unit 746 may display a result diagnosed by the diagnosis unit 744. The display unit 746 may be provided as an oscilloscope for converting a waveform into an electrical signal. The conversion unit 742, the diagnosis processing unit 744, and the display unit 746 may be connected by wire or wirelessly to enable communication with each other.

Accordingly, according to an embodiment of the inventive concept, it is possible to efficiently determine an abnormal state of the driving unit by analyzing the waveform of the air vibration in the transfer space without the operator having to directly check the driving unit (e.g. the hand driving unit 522, the rotation driving unit 523, the vertical driving unit 524, the horizontal driving unit 525). Since the airflow formed in the transfer space may be blocked by the mesh structure of the inlet part 722 and only a vibration of air generated by the driving unit may be introduced, the diagnostic reliability of the driving part provided in the transfer chamber 240 may be increased.

Figure 6:
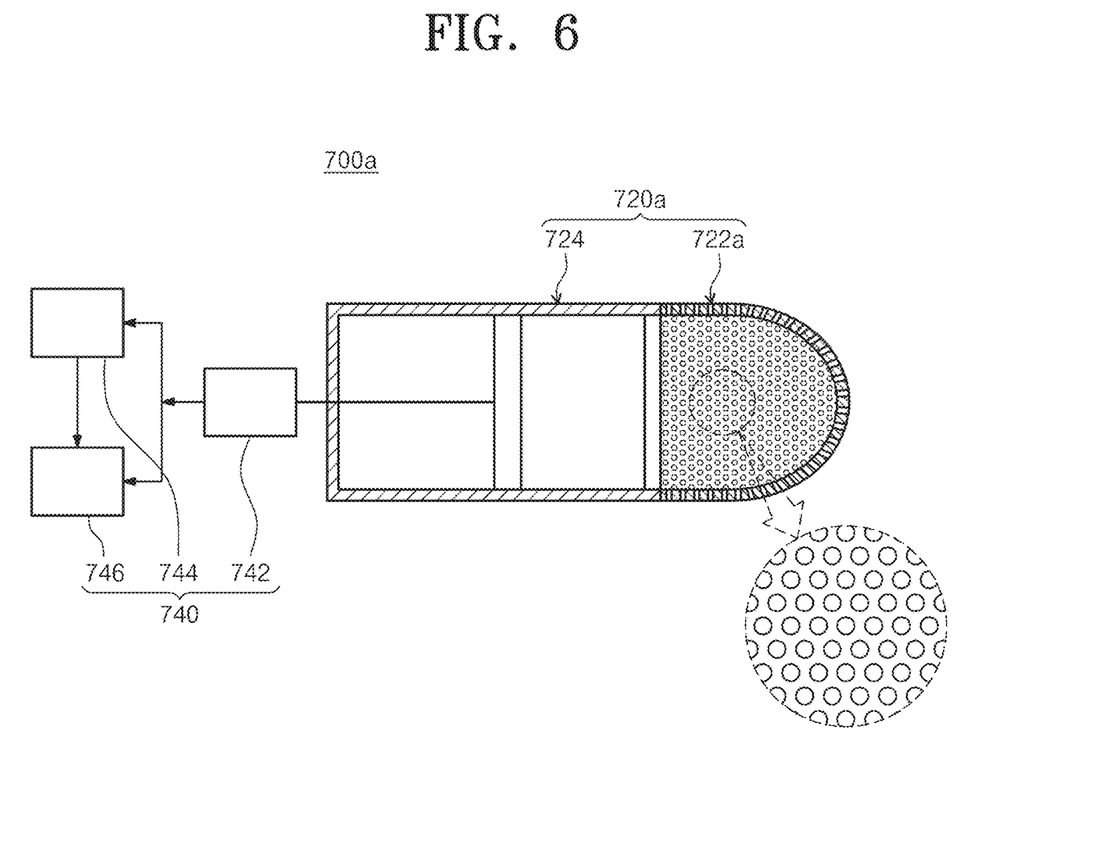
FIG. 6 and FIG. 7 are views illustrating another embodiment of the diagnosis unit of FIG. 4.
Figure 7:
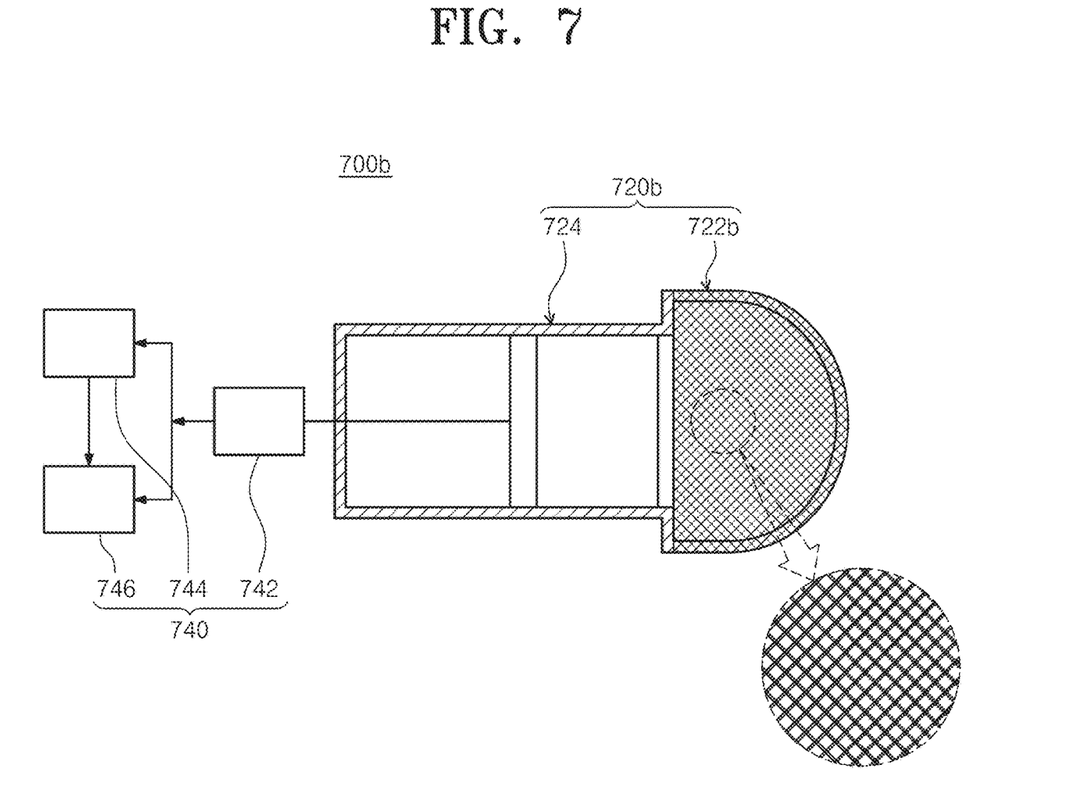

FIG. 6 and FIG. 7 are views illustrating another embodiment of the diagnosis unit 700 of FIG. 4. Hereinafter, the differences from the above-described embodiment of the diagnosis unit 700 will be mainly described.

Referring to FIG. 6, the inlet part 722a of the diagnosis unit 700a introduces an air vibrating in the inner transfer space of the transfer chamber 240. The inlet part 722a may extend from one end of the body part 724 and may have a substantially rounded shape in its end. The inlet part 722a may be formed of a plastic material. The inlet part 722a may be provided as a porous member. The inlet part 722a may include a plurality of through holes perforated in an outer circumferential surface. The inlet part 722a introduces the vibration of the air inside the transfer space through the through holes. The through holes can be provided with very small micropores. Accordingly, the airflow formed inside the transfer space may be blocked, and only the vibration of the air generated by the driving unit may be introduced.

Referring to FIG. 7, the inlet part 722b of the diagnosis unit 700b receives the vibration of the air in an inner transfer space of the transfer chamber 240. The inlet part 722b may extend from one end of the body part 724 along the lengthwise direction thereof and end in a rounded shape and may further protrude in a direction orthogonal to the lengthwise direction of the body part 724. The inlet part 722b may be provided with a mesh structure or a porous member. The inlet part 722b may be made of a plastic material. However, a shape of the inlet part 722b is not limited thereto, and may be modified into various shapes and provided.

Figure 8:
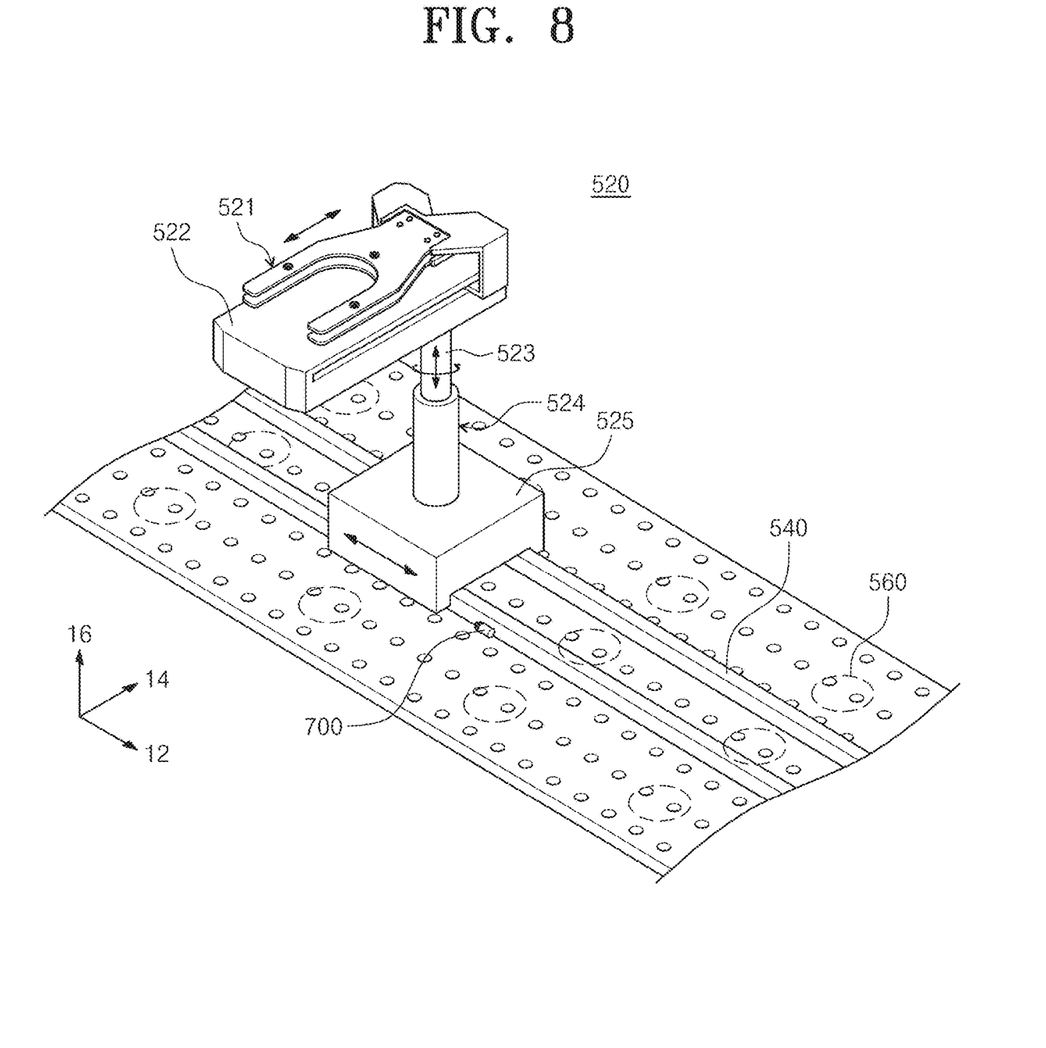
FIG. 8 and FIG. 9 are views schematically illustrating an embodiment of a location where a diagnosis unit is provided to the substrate treating apparatus.
Figure 9:
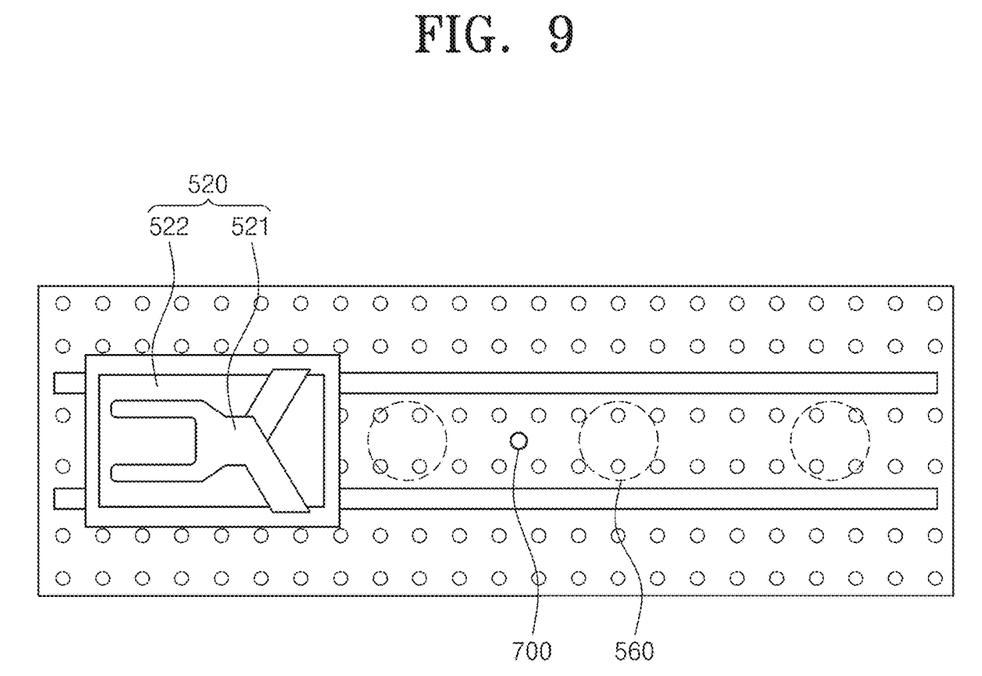

FIG. 8 to FIG. 9 are views schematically illustrating an embodiment of a location where the diagnosis unit 700 is installed in the substrate treating apparatus 10. Referring to FIG. 8 to FIG. 9, the diagnosis unit 700 may be installed on a stationary member whose position does not move in the transfer chamber 240. In an embodiment, the diagnosis unit 700 may be installed at a middle point of the transfer rail 540. A direction from the inlet part 722 of the diagnosis unit 700 to the body part 724 may be parallel to a lengthwise direction of the transfer rail 540. For example, the diagnosis unit 700 may be installed on a top surface or a bottom surface of the transfer chamber 240. The diagnosis unit 700 may be installed such that a lengthwise direction from the body part 724 to the inlet part 722 of the diagnosis unit 700 may be parallel to a direction from the bottom surface toward the top surface of the transfer chamber 240. The diagnosis unit 700 may be disposed inside the transfer chamber 240 and installed on a stationary member. The diagnosis unit 700 may be installed in a place where an amount of movement of the stationary member moving in the transfer chamber 240 is the largest among stationary members provided inside the transfer chamber 240. For example, the diagnosis unit 700 may be installed on the transfer rail 540 having a fixed position, and may be installed at the middle point of the transfer rail 540 having a largest amount of movement of the transfer robot 520 moving therebetween. The diagnosis unit 700 may be installed so that the vibration of the air generated by the driving unit provided within the transfer chamber 240 is introduced in a direction orthogonal to the inlet 722. By installing the diagnosis unit 700 in a place with the largest amount of movement in the transfer space, it is possible to increase a frequency of vibration inflow of air into the driving part provided inside the transfer chamber 240. For this reason, it is possible to accumulate an amount of data capable of diagnosing whether the driver is abnormal in real time, thereby increasing a reliability of diagnosing the driver's abnormal state.

Hereinafter, an embodiment in which the diagnosis unit 700 is provided to the treating module 200 has been described. The inventive concept is not limited thereto, and the diagnosis unit 700 may be provided to the transfer assembly. The transfer assembly may include a housing, a transfer robot, and a transfer rail.

The housing provides a transfer space for transferring the substrate W. In an embodiment, the housing may be a transfer frame 140 provided to the index module 100 or a transfer chamber 240 provided to the treating module 200. However, the inventive concept is not limited thereto, and the housing refers to any substrate treating apparatuses having a transfer space for transferring the substrate W. The transfer robot is provided in the transfer space inside the housing and transfers the substrate W. For example, the transfer robot may be an index robot 144 provided in the transfer space of the transfer frame 140 or a transfer robot 520 provided in the transfer space of the transfer chamber 240. However, the inventive concept is not limited thereto, and the transfer robot includes various robot units used in a transfer device for transferring the substrate W. The transfer rail is installed along a lengthwise direction of the housing. The transfer robot is installed on the transfer rail and moves linearly along the transfer rail. For example, the transfer rail may be an index rail 142 provided in the transfer space of the transfer frame 140 or a transfer rail 540 provided in the transfer space of the transfer chamber 240. However, the inventive concept is not limited thereto, and includes a rail installed to allow a robot for transferring the substrate W to move linearly.

When the transfer assembly 600 is provided to the index module 100, in an embodiment, the first unit may be a load port 120, and the second unit may be a buffer unit 220. When the transfer assembly 600 is provided to the treating module 200, in an embodiment, the first unit may be a process chamber 260, and the second unit may be a process chamber 260 different from the first unit. In addition, the first unit may be a process chamber 260, and the second unit may be a buffer unit 220.

In the above-described example, a case in which the transfer assembly 600 is provided to the treating module 200 is described as an example, but the inventive concept is not limited thereto. For example, the transfer assembly 600 and the diagnosis unit 700 installed in the housing may be applied in the same/similar manner even when provided to the index module 100. In addition, the transfer assembly 600 and the diagnosis unit 700 installed in the housing may be equally/similarly applied to a substrate treating device having a transfer space for transferring the substrate W. For example, the transfer rail 540 may be applied equally/similarly to a transfer device (e.g., an overhead transfer device) for transferring the substrate W. In addition, the transfer rail 540 may be applied in the same/similar manner to the tower lift that moves a container in which an article is accommodated in the up/down direction.

In the above-described example, the process chamber 260 of the substrate treating apparatus 10 supplies a treating liquid to perform a liquid treating process of treating the substrate W, but the inventive concept is not limited thereto. For example, the process chamber 260 of the substrate treating apparatus 10 may perform a coating process of forming a liquid film on the substrate W by supplying a photoresist solution, or may perform a plasma process of treating the substrate W using a plasma. In addition, the process chamber 260 may perform a supercritical drying process of treating the substrate W using a supercritical fluid. That is, the transfer assembly 600 and the diagnosis unit 700 installed in the housing according to an embodiment of the inventive concept may be variously applied to a known substrate treating apparatus provided with a member whose position moves.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
    a process chamber configured to treat a substrate;
    a transfer assembly configured to transfer the substrate to the process chamber; and
    a diagnosis unit configured to detect an abnormal state of the transfer assembly, and
    wherein the transfer assembly comprises:
    a housing having a transfer space and including a transfer chamber and at least two guide rails on a floor of the transfer chamber; and
    a transfer robot configured to transfer the substrate to the process chamber, and
    wherein the diagnosis unit comprises:
    a detection member configured to detect an air vibration generated within the housing; and
    a diagnosis member configured to diagnose a driving unit of the transfer assembly based on the air vibration detected by the detection member, and
    wherein the detection member is fixed to the floor of the transfer chamber and at a midpoint between the at least two guide rails.

2. The substrate treating apparatus of claim 1, wherein the transfer robot is configured to slide over the detection member.

3. The substrate treating apparatus of claim 1, wherein the floor of the transfer chamber defines a plurality of exhaust members.

4. The substrate treating apparatus of claim 1, wherein the detection member comprises:
    an inlet part configured to introduce the air vibration generated within the housing; and
    a body part having a valve configured to provide a vibration in response to the air vibration introduced from the inlet part.

5. The substrate treating apparatus of claim 4, wherein the inlet part includes a porous member.

6. The substrate treating apparatus of claim 4, wherein the inlet part is a plastic material.

7. The substrate treating apparatus of claim 4, wherein the inlet part includes a mesh structure.

8. The substrate treating apparatus of claim 7, wherein the diagnosis member comprises:
    a conversion unit configured to convert the vibration of the valve to a waveform;
    a diagnosis processing unit configured to diagnose the waveform converted by the conversion unit; and
    a display unit configured to display a result of the diagnosing of the waveform.

9. The substrate treating apparatus of claim 8, wherein the diagnosis processing unit is configured to determine the driving unit of the transfer assembly to be in an abnormal state in response to a peak value of the waveform converted by the conversion unit being outside a preset normal range waveform.

10. A substrate treating apparatus comprising:
a first unit;
a second unit different from the first unit;
a transfer assembly configured to transfer a substrate between the first unit and the second unit; and
a diagnosis unit configured to detect an abnormal state of the transfer assembly, and
wherein the transfer assembly comprises:
a housing having a transfer space and including a transfer chamber and at least two guide rails on a floor of the transfer chamber; and
a transfer robot configured to transfer the substrate, and
wherein the diagnosis unit comprises:
a detection member configured to detect an air vibration generated within the housing; and
a diagnosis member configured to diagnose a driving unit of the transfer assembly based on the air vibration detected by the detection member, and
wherein the detection member is fixed to the floor of the transfer chamber and at a midpoint between the at least two guide rails.

11. The substrate treating apparatus of claim 10, wherein the floor of the transfer chamber defines a plurality of exhaust members.

12. The substrate treating unit of claim 10, wherein the detection member comprises:
an inlet part configured to introduce the air vibration generated within the housing; and
a body part having a valve configured to provide a vibration in response to the air vibration introduced from the inlet part.

13. The substrate treating apparatus of claim 12, wherein the inlet part is a plastic material.

14. The substrate treating apparatus of claim 12, wherein the inlet part includes a mesh structure.

15. The substrate treating apparatus for claim 14, wherein the diagnosis member comprises:
a conversion unit configured to convert the vibration of the valve a waveform;
a diagnosis processing unit configured to diagnose the waveform converted by the conversion unit; and
a display unit configured to display the result of the analyzing the waveform.

16. The substrate treating apparatus of claim 15, wherein the diagnosis processing unit is configured to determine the driving unit of the transfer assembly to be in an abnormal state in response to a peak value of the waveform converted by the conversion unit being outside a preset normal range waveform.

17. A substrate treating apparatus comprising:
an index module having a load port configured to place a container storing a substrate therein;
a treating module having a process chamber configured to perform a process of treating the substrate;
a transfer assembly arranged at least one of the index module and the treating module, and configured to transfer the substrate; and
a diagnosis unit configured to detect an abnormal state of the transfer assembly, and
wherein the transfer assembly comprises:
a housing having a transfer space and including a transfer chamber and at least two guide rails on a floor of the transfer chamber; and
a transfer robot configured to transfer the substrate, and
wherein the diagnosis unit comprises:
an inlet part configured to introduce an air vibration generated within the housing; and
a body part having a valve configured to provide a vibration in response to the air vibration introduced from the inlet part,
wherein the inlet part includes a mesh structure, and
wherein the diagnosis unit is fixed to the floor of the transfer chamber and at a midpoint between the at least two guide rails.

18. The substrate treating apparatus of claim 17, wherein the diagnosis unit further comprises:
a conversion unit configured to convert the vibration of the valve to a waveform;
a diagnosis processing unit configured to diagnosis the waveform converted by the conversion unit; and
a display unit configured to display the result of the analyzing the waveform, and
wherein a driving unit of the transfer assembly is determined to be in an abnormal state in response to a peak value of the waveform converted by the conversion unit being outside a preset normal range waveform.

19. The substrate treating apparatus of claim 17, wherein the floor of the transfer chamber defines a plurality of exhaust members.

20. The substrate treating apparatus of claim 17, wherein the inlet part is a plastic material.

* * * * *